(12) United States Patent
Dang et al.

(10) Patent No.: US 10,103,106 B2
(45) Date of Patent: Oct. 16, 2018

(54) WAFER LEVEL FAN-OUT WITH ELECTROMAGNETIC SHIELDING

(71) Applicant: Qorvo US, Inc., Greensboro, NC (US)

(72) Inventors: Thong Dang, Summerfield, NC (US); Dan Carey, Kernersville, NC (US); Ma Shirley Asoy, High Point, NC (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 15/411,425

(22) Filed: Jan. 20, 2017

(65) Prior Publication Data

US 2017/0133326 A1 May 11, 2017

Related U.S. Application Data (63) Continuation of application No. 15/080,001, filed on Mar. 24, 2016, now Pat. No. 9,570,406.
(Continued)

(51) Int. Cl.
*H01L 23/552* (2006.01)
*H01L 23/498* (2006.01)
(Continued)

(52) U.S. Cl.
CPC .......... *H01L 23/552* (2013.01); *H01L 21/485* (2013.01); *H01L 21/4853* (2013.01);
(Continued)

(58) Field of Classification Search
CPC ............. H01L 23/552; H01L 23/49822; H01L 23/49838; H01L 23/49811;
(Continued)

(56) References Cited

U.S. PATENT DOCUMENTS 8,062,930 B1   11/2011   Shah et al.
8,110,441 B2    2/2012   Chandra et al.
(Continued)

OTHER PUBLICATIONS

Author Unknown, "RDL—Bond Pad Redistribution Layers," Yield Engineering Systems, Inc., Date Unknown, 4 pages, www.yieldengineering.com/portals/0/yes-rdl_explanation.pdf.
(Continued)

*Primary Examiner* — Savitr Mulpuri
(74) *Attorney, Agent, or Firm* — Withrow & Terranova, P.L.L.C.

(57) ABSTRACT

The present disclosure relates to an integrated circuit module with electromagnetic shielding. The integrated circuit module includes a die with an input/output (I/O) port at a bottom surface of the die, a mold compound partially encapsulating the die and leaving the bottom surface of the die exposed, a first dielectric pattern over the bottom surface of the die, a redistribution structure over the first dielectric pattern, and a shielding structure. The I/O port at the bottom surface of the die is exposed through the first dielectric pattern. The redistribution structure includes a shield connected element that is coupled to the I/O port and extends laterally beyond the die. The shielding structure resides over a top surface of the mold compound, extends along side surfaces of the mold compound, and is in contact with the shield connected element. Herein, the shielding structure does not extend vertically beyond the shield connected element.

14 Claims, 7 Drawing Sheets

Related U.S. Application Data (60) Provisional application No. 62/168,951, filed on Jun. 1, 2015.

(51) Int. Cl.
*H01L 23/31* (2006.01)
*H01L 25/065* (2006.01)
*H01L 21/48* (2006.01)
*H01L 21/56* (2006.01)
*H01L 21/78* (2006.01)

(52) U.S. Cl.
CPC ........ *H01L 21/4857* (2013.01); *H01L 21/565* (2013.01); *H01L 21/78* (2013.01); *H01L 23/3114* (2013.01); *H01L 23/49811* (2013.01); *H01L 23/49822* (2013.01); *H01L 23/49838* (2013.01); *H01L 23/49866* (2013.01); *H01L 23/49894* (2013.01); *H01L 25/0655* (2013.01)

(58) Field of Classification Search
CPC ......... H01L 23/49866; H01L 23/49894; H01L 23/3114; H01L 25/0655; H01L 21/485; H01L 21/4853; H01L 21/4857; H01L 21/565
See application file for complete search history.

(56) References Cited

U.S. PATENT DOCUMENTS

| | | | | |
|---|---|---|---|---|
| 8,168,470 | B2* | 5/2012 | Lin | ............... H01L 21/486 438/107 |
| 8,299,446 | B2 | 10/2012 | Hawryluk et al. | |
| 8,877,555 | B2 | 11/2014 | Shi et al. | |
| 9,240,392 | B2 | 1/2016 | Hurwitz et al. | |
| 9,362,196 | B2 | 6/2016 | Yamada et al. | |
| 9,570,406 | B2 | 2/2017 | Dang et al. | |
| 2010/0172116 | A1* | 7/2010 | Yorita | ............... H01L 21/565 361/816 |
| 2010/0207259 | A1* | 8/2010 | Liao | ............... H01L 21/6835 257/660 |
| 2011/0006408 | A1* | 1/2011 | Liao | ............... H01L 21/561 257/660 |
| 2012/0015687 | A1* | 1/2012 | Yamada | ............... H01L 23/3128 455/550.1 |
| 2012/0044653 | A1 | 2/2012 | Morris et al. | |
| 2012/0199958 | A1 | 8/2012 | Horibe | |
| 2015/0021754 | A1* | 1/2015 | Lin | ............... H01L 23/5389 257/712 |
| 2015/0279789 | A1* | 10/2015 | Mahajan | ............... H01L 23/552 257/659 |
| 2015/0294896 | A1 | 10/2015 | Hurwitz et al. | |
| 2016/0073496 | A1* | 3/2016 | Vincent | ............... H05K 1/0298 361/772 |
| 2016/0189983 | A1 | 6/2016 | Shi | |
| 2016/0190028 | A1 | 6/2016 | Shi | |
| 2016/0351509 | A1 | 12/2016 | Dang et al. | |

OTHER PUBLICATIONS

Kurita, Y., et al., "Fan-Out Wafer-Level Packaging with Highly Flexible Design Capabilities," 2010 3rd Electronic System-Integration Technology Conference, Sep. 13-16, 2010, pp. 1-6.

Wojnowski, Maciej, et al., "Package Trends for Today's and Future mm-Wave Applications," 38th European Microwave Conference, 2008, Infineon, PowerPoint presentation, 55 slides.

Notice of Allowance and Examiner-Initiated Interview Summary for U.S. Appl. No. 15/080,001, dated Oct. 6, 2016, 15 pages.

* cited by examiner

WAFER LEVEL FAN-OUT WITH ELECTROMAGNETIC SHIELDING

RELATED APPLICATIONS

This application is a continuation of U.S. patent application Ser. No. 15/080,001, filed Mar. 24, 2016, entitled "WAFER LEVEL FAN-OUT WITH ELECTROMAGNETIC SHIELDING," which claims the benefit of U.S. provisional patent application No. 62/168,951, filed Jun. 1, 2015, the disclosures of which are incorporated herein by reference in their entirety.

FIELD OF THE DISCLOSURE

The present disclosure relates to an integrated circuit module, and more particularly to an integrated circuit module with electromagnetic shielding.

BACKGROUND

Electronic components have become ubiquitous in modern society. The electronics industry proudly, but routinely, announces accelerated clocking and transmission speeds and smaller integrated circuit modules. While the benefits of these devices are myriad, smaller and faster electronic devices create problems. In particular, high operating frequencies inherently require fast transitions between signal levels. Fast transitions between signal levels create electromagnetic emissions throughout the electromagnetic spectrum. Such emissions are regulated by the Federal Communications Commission (FCC) and other regulatory agencies. The electromagnetic emissions radiate from a source and may impinge upon other electronic components. If the signal strength of the emissions at the impinged upon electronic component is high enough, the emissions may interfere with the operation of the impinged upon electronic component. This phenomenon is sometimes called electromagnetic interference (EMI) or crosstalk.

One way to reduce EMI is to shield the integrated circuit modules that cause EMI or that are sensitive to EMI. Typically the shield is formed of a grounded conductive material that covers a circuit module or a portion thereof. The shield may be formed during a packaging process. When electromagnetic emissions from electronic components within the shield strike the interior surface of the shield, the electromagnetic emissions are electrically shorted through the grounded conductive material, thereby reducing emissions. Likewise, when emissions from outside the shield strike the exterior surface of the shield, a similar electrical short occurs, and the electronic components do not experience the emissions.

Wafer level fan-out (WLFO) packaging technology currently attracts substantial attention in the 3D packaging area. WLFO technology is designed to provide high density input/output ports (I/O) without increasing the size of a semiconductor package. This capability allows for densely packaged small integrated circuit modules within a single wafer. As the size of the integrated circuit module is reduced, the need for isolation between various types of functional integrated circuit modules in close proximity to one another increases. Unfortunately, as the integrated circuit modules continue to become smaller from miniaturization, creating effective shields that do not materially add to the size of the integrated circuit module adds complexity and cost to the fabrication process.

As such, there is a need for an electromagnetic shield that is inexpensive to manufacture on a large scale, does not substantially change the size of the integrated circuit module, and effectively deals with interference caused by unwanted electromagnetic emissions.

SUMMARY

The present disclosure relates to an integrated circuit module with electromagnetic shielding. The disclosed integrated circuit module includes a die with an input/output (I/O) port at a bottom surface of the die, a mold compound, a first dielectric pattern, a redistribution structure, a second dielectric pattern, a bump contact, and a shielding structure. The mold compound partially encapsulates the die leaving the bottom surface of the die exposed. The first dielectric pattern is over the bottom surface of the die and the I/O port at the bottom surface of the die is exposed through the first dielectric pattern. The redistribution structure is over the first dielectric pattern. Herein, the redistribution structure includes a shield connected element that is coupled to the I/O port and extends laterally beyond the die. The second dielectric pattern is over the redistribution structure and a bottom portion of the shield connected element is exposed through the second dielectric pattern. The bump contact is connected to the exposed bottom portion of the shield connected element. The shielding structure resides over a top surface of the mold compound, extends along side surfaces of the mold compound, and is in contact with the shield connected element. Herein, the shielding structure does not extend vertically beyond the shield connected element.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

The present disclosure relates to integrating electromagnetic shielding into a wafer level fan-out (WLFO) packaging process, where the process includes forming a shielding structure over each of a number of modules. WLFO packaging processes normally use 300 mm diameter wafers with a wide range of package thickness. For the present disclosure, the WLFO packaging process with electromagnetic shielding focuses on packages that are less than 400 microns (μms) thick. FIGS. 1A-1D illustrate an exemplary process to provide a mold wafer having a number of modules. FIG. 2 provides a flow diagram that illustrates an exemplary WLFO packaging process with electromagnetic shielding according to one embodiment of the present disclosure. FIGS. 3A-3L illustrate the steps associated with the WLFO packaging process of FIG. 2.

Figure 1A:
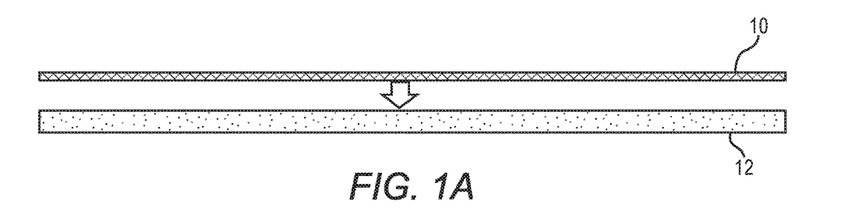
FIGS. 1A-1D illustrate an exemplary process to provide a mold wafer having a number of modules.
Figure 1B:
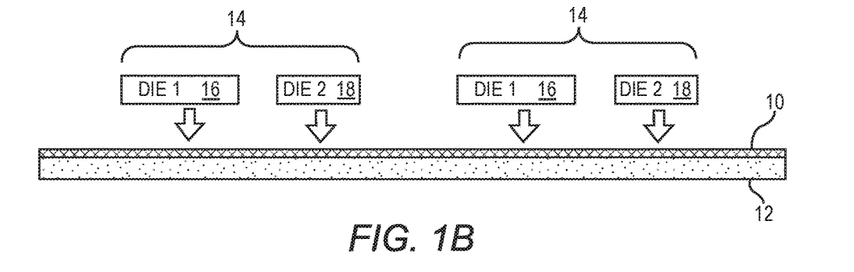
Figure 1C:
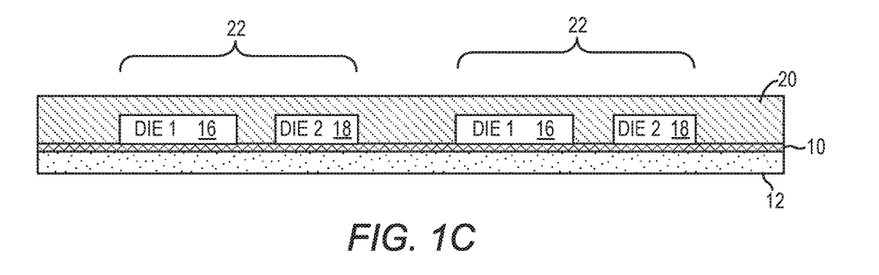
Figure 1D:
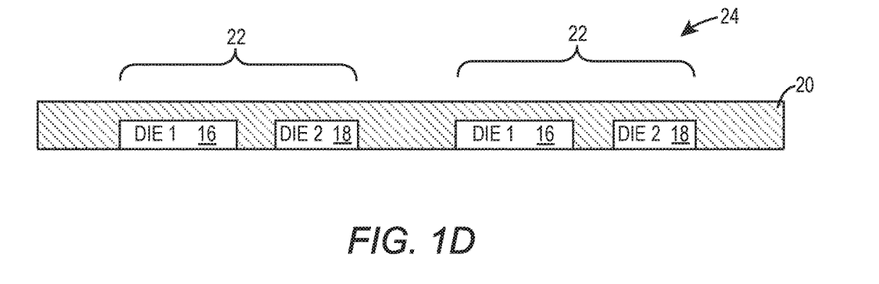
Figure 2:
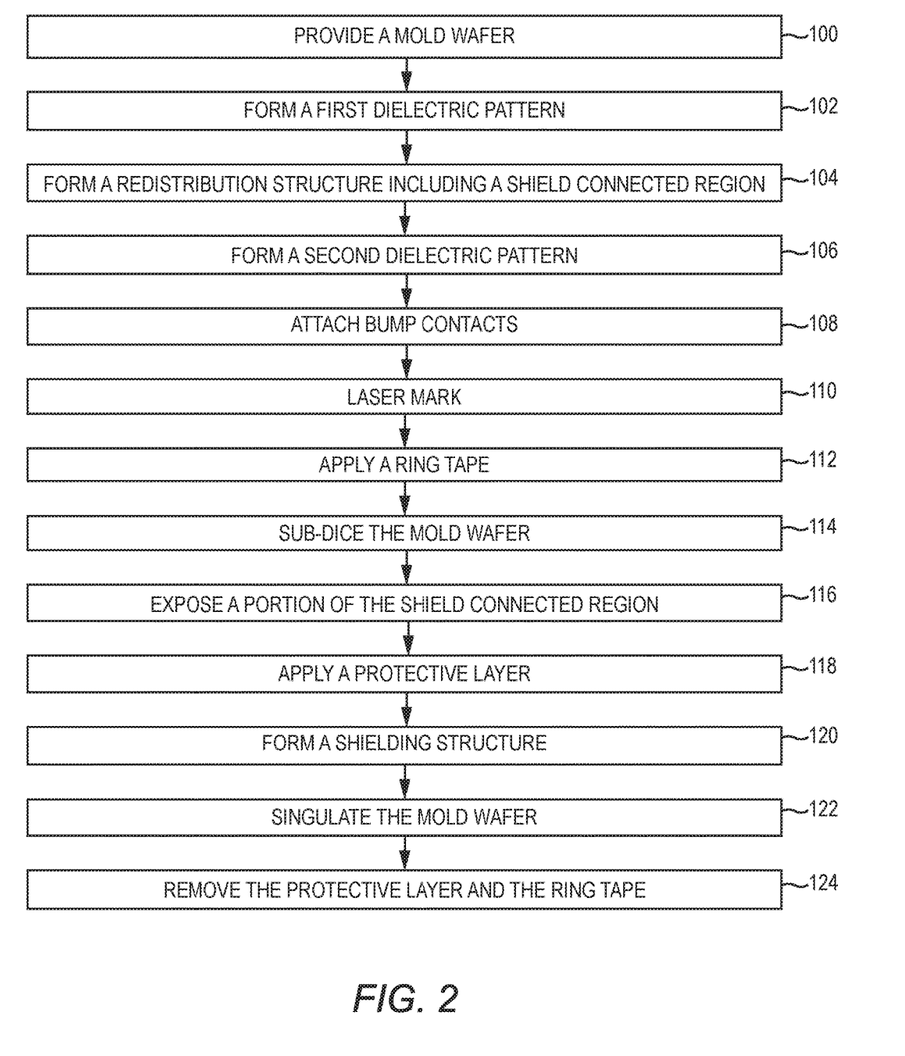
FIG. 2 provides a flow diagram that illustrates an exemplary wafer level fan-out (WLFO) packaging process with electromagnetic shielding according to one embodiment of the present disclosure.

Initially, an adhesive layer 10 is applied on a top surface of a carrier 12 as depicted in FIG. 1A; and a number of electronic component groups 14 are attached to the adhesive layer 10 as depicted in FIG. 1B. For the purpose of this illustration, each electronic component group 14 includes a first die 16 with a thickness between 30 μms-160 μms and a second die 18 with a thickness between 30 μms-160 μms. The first die 16 has a first I/O port (not shown) at a bottom surface of the first die 16 and the second die 18 has a second I/O port (not shown) at a bottom surface of the second die 18. The first I/O port and the second I/O port are used to connect to ground. In different applications, each electronic component group may include fewer or more semiconductor dies and may also include other electronic components. Next, a mold compound 20 is applied over the number of electronic component groups 14 to form multiple modules 22 as depicted in FIG. 1C. The mold compound 20 may be applied by various procedures, such as sheet molding, overmolding, compression molding, transfer molding, dam fill encapsulation, or screen print encapsulation. The adhesive layer 10 and the carrier 12 are then removed to provide a mold wafer 24 with the multiple modules 22, as depicted in FIG. 1D. Removal of the adhesive layer 10 and the carrier 12 may be provided by heating the adhesive layer 10. The mold wafer 24 has a thickness between 130 μms-350 μms. For each of the multiple modules 22, the bottom surfaces of the first die 16 and the second die 18 are exposed.

Figure 3A:
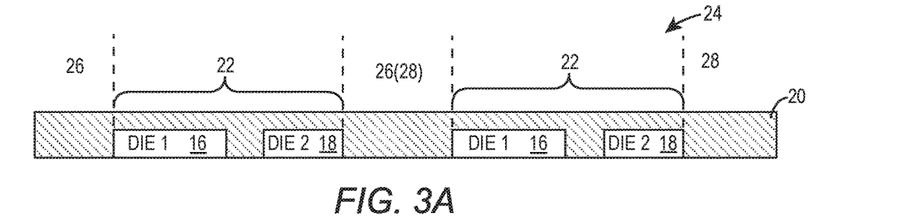
FIGS. 3A-3L illustrate the steps associated with the WLFO packaging process of FIG. 1.

With reference to FIGS. 3A through 3E, a redistribution process is provided according to one embodiment of the present disclosure. The process begins by providing the mold wafer 24, as depicted in FIG. 3A (Step 100). The mold wafer 24 includes the multiple modules 22 and each of the multiple modules 22 includes the first die 16 with the first I/O port (not shown) and the second die 18 with the second I/O port (not shown). The first die 16 and the second die 18 are partially encapsulated by the mold compound 20 leaving the bottom surfaces of the first die 16 and the second die 18 exposed. Each of the multiple modules 22 is surrounded by a first inter-module area 26 adjacent to the first die 16 and a second inter-module area 28 adjacent to the second die 18. The first inter-module area 26 and the second inter-module area 28 for adjacent modules of the multiple modules 22 are formed from a common inter-module area 26 (28).

Figure 3B:
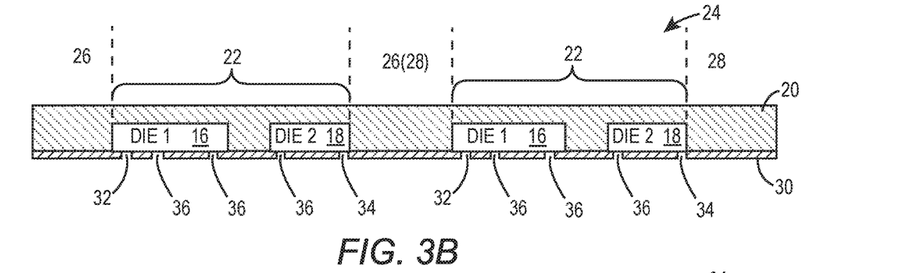

Then, a first dielectric pattern 30 is formed over a bottom surface of the mold wafer 24, as depicted in FIG. 3B (Step 102). The first dielectric pattern 30 may be formed of benzocyclobutene (BCB), polyimide, or other dielectric materials. The first I/O port (not shown) at the bottom surface of the first die 16 is exposed through the first dielectric pattern 30 at a location 32 for each module. The second I/O port (not shown) at the bottom surface of the second die 18 is exposed through the first dielectric pattern 30 at a location 34 for each module. In different applications, there may be other I/O ports (not shown) at the bottom surfaces of the first die 16 and the second die 18 exposed through the first dielectric pattern 30 at locations 36.

Figure 3C:
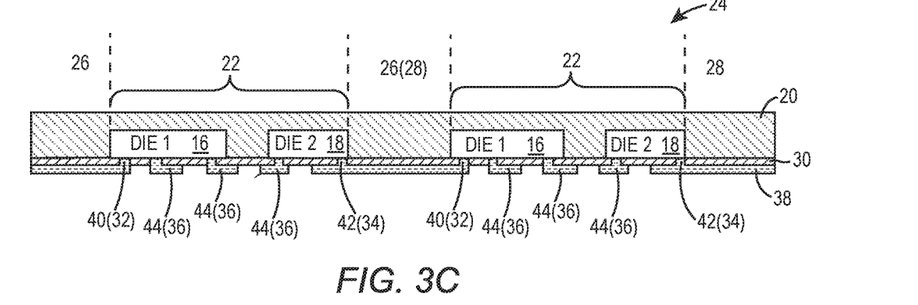

The next process step is to form a redistribution structure 38 over the first dielectric pattern 30, as depicted in FIG. 3C (Step 104). The redistribution structure 38 may be formed of copper or other suitable conductive material. As illustrated, the redistribution structure 38 includes multiple conductive elements. These conductive elements generally connect with the various I/O ports (not shown) at the bottom surfaces of the first die 16 and the second die 18. The redistribution structure 24 includes a first shield connected element 40 that is coupled to the first I/O port (not shown) at the location 32 and extends laterally from the first I/O port (not shown) into the first inter-module area 26 for each of the multiple modules 22. The redistribution structure 24 also includes a second shield connected element 42 that is coupled to the second I/O port (not shown) at the location 34 and extends laterally from the second I/O port (not shown) into the second inter-module area 28 for each of the multiple modules 22. Further, the redistribution structure 24 includes non-shield connected elements 44 that are coupled to other I/O ports (not shown) at the locations 36 at the bottom surfaces of the first die 16 and the second die 18. The non-shield connected elements 44 do not extend to either the first inter-module area 26 or the second inter-module area 28. Notice that the first shield connected element 40 and the second shield connected element 42 of the adjacent modules of the multiple modules 22 may be formed from a common section of the redistribution structure 38 (i.e. the central section in FIG. 3C).

Figure 3D:
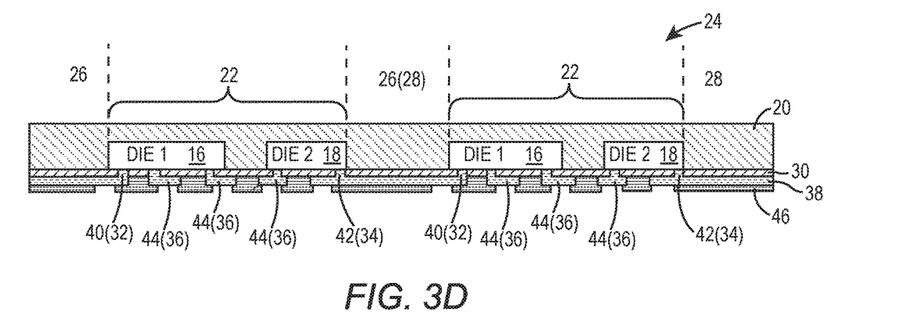
Figure 3E:
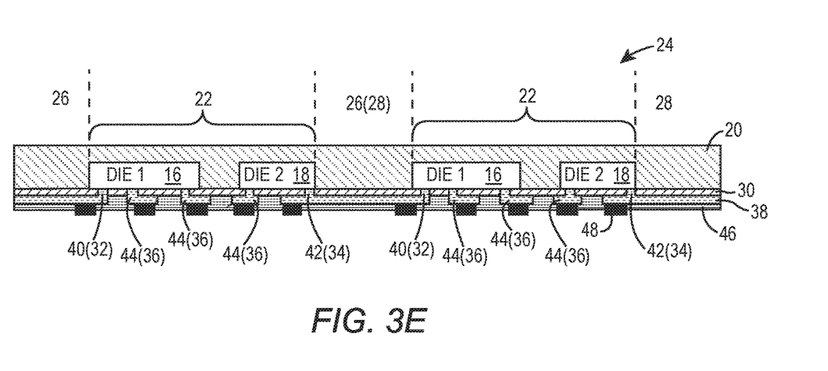

Next, a second dielectric pattern 46 is formed over the redistribution structure 38 as depicted in FIG. 3D (Step 106). The second dielectric pattern 46 may be formed of benzocyclobutene (BCB), polyimide or other dielectric materials. Herein a bottom portion of the first shield connected element 40, a bottom portion of the second shield connected element 42, and a bottom portion of each of the non-shield connected elements 44 are exposed through the second dielectric pattern 46. A total thickness of the first dielectric pattern 30, the redistribution structure 38, and the second dielectric pattern 46 is approximately 30 μms-40 μms. Bump contacts 48 are then applied to the exposed bottom portions of the first shield connected element 40, the second shield connected element 42, and the non-shield connected elements 44, as depicted in FIG. 3E (Step 108). The bump contacts 48 may be applied by a standard bumping procedure or a land grid arrays process.

Figure 3F:
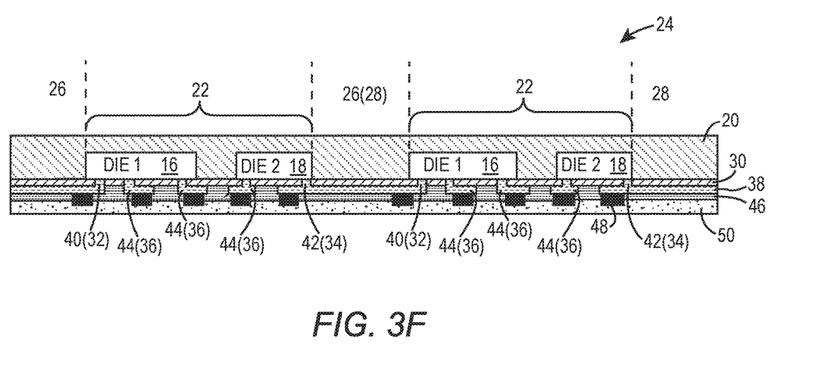

With reference to FIGS. 3F through 3L, a process for shielding each of the multiple modules 22 is provided according to one embodiment of the present disclosure. After a laser mark process (Step 110), a ring tape 50 with strong chemical resistance is applied over the second dielectric pattern 46 to encapsulate the bump contacts 48 as depicted in FIG. 3F (Step 112). The main purpose of the ring tape 50 is to provide a wafer support to the mold wafer 24 during the following sub-dicing process. Herein, the ring tape 50 includes two layers: an adhesive layer (not shown) in contact with the second dielectric pattern 46 and a backer layer (not shown) that may be formed of polyolefin materials. The ring tape 50 has a thickness between 80 μms-180 μms.

Figure 3G:
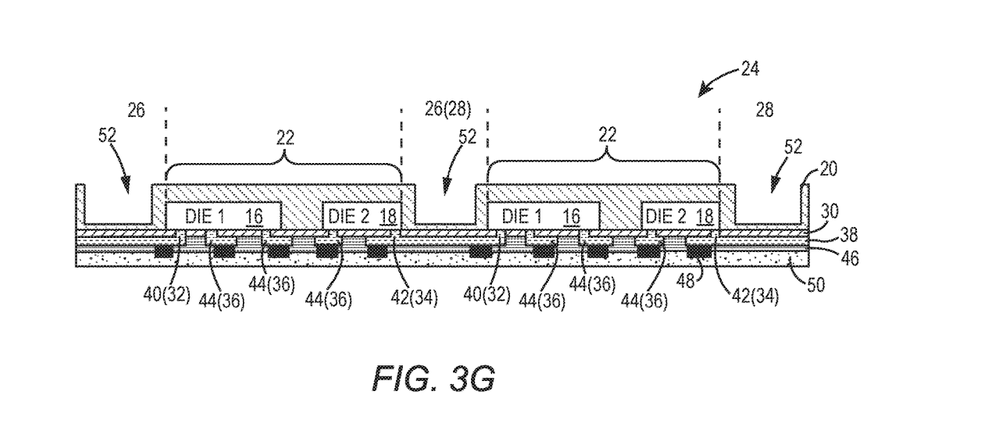

Next, the mold wafer 24 is sub-diced at each inter-module area 26/28 to create an elongated cavity 52 that may substantially or completely surround each of the multiple modules 22, as depicted in FIG. 3G (Step 114). The elongated cavity 52 extends into the mold wafer 24 from a top surface of the mold wafer 24, without extending completely through the mold compound 20. In one embodiment, sub-dicing the mold wafer 24 at each inter-module area 26/28 refers to forming the elongated cavity 52 such that the elongated cavity 52 extends between 60%-97%, and perhaps between 75%-95%, into the mold compound 20. Normally, at the bottom of the elongated cavity 52, there remains a thin layer of the mold compound 20 over the redistribution structure 38. More specifically, at the bottom of the elongated cavity 52, there remains a thin layer of the mold compound 20 over the first shield connected element 40 for one of the multiple modules 22 and over the second shield connected element 42 for an adjacent module of the multiple modules 22. In addition, the mold compound 20 is also left on the sidewalls of the elongated cavity 52. The first die 16 and the second die 18 are exposed in the elongated cavity 52.

Figure 3H:
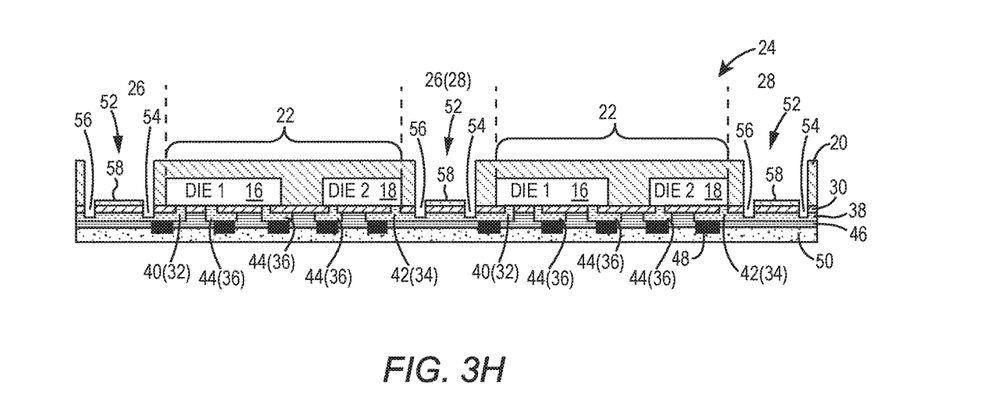

After the sub-dicing procedure is completed, a portion of the first shield connected element 40 and a portion of the second shield connected element 42 are exposed through the bottom of the elongated cavity 52, as depicted in FIG. 3H (Step 116). In detail, a first portion of the mold compound 20 and a first portion of the first dielectric pattern 30 at the bottom of the elongated cavity 52 are removed to form a channel 54 that exposes a portion of the first shield connected element 40. A second portion of the mold compound 20 and a second portion of the first dielectric pattern 30 at the bottom of the elongated cavity 52 are removed to form a channel 56 that exposes a portion of the second shield connected element 42. The channels 54 and 56 may be formed on opposite sides of the elongated cavity 52 and adjacent to the side walls of the elongated cavity 52 such that a mesa 58 may remain between the channels 54 and 56 in the elongated cavity 52. Herein, the channels 54 and 56 within the same elongated cavity 52 are formed for the adjacent modules of the multiple modules 22. A portion of the first shield connected element 40 and a portion of the second shield connected element 42 may be removed during the exposing process. In one embodiment, the first shield connected element 40 and the second shield connected element 42 may be exposed using laser drilling. In the illustrated embodiment, the channels 54 and 56 are drilled into the elongated cavity 52 to expose a portion of the first shield connected element 40 and a portion of the second shield connected element 42, respectively. The channels 54 and 56 may extend through the first dielectric pattern 30 and either to or into the first shield connected element 40 and the second shield connected element 42, respectively. The elongated cavity 52, the channels 54 and 56, and the mesa 58 may substantially or completely surround each of the multiple modules 22, such that nearly all of the vertical sides and top surfaces of each of the multiple modules 22 will be effectively shielded in a later shielding process.

Figure 3I:
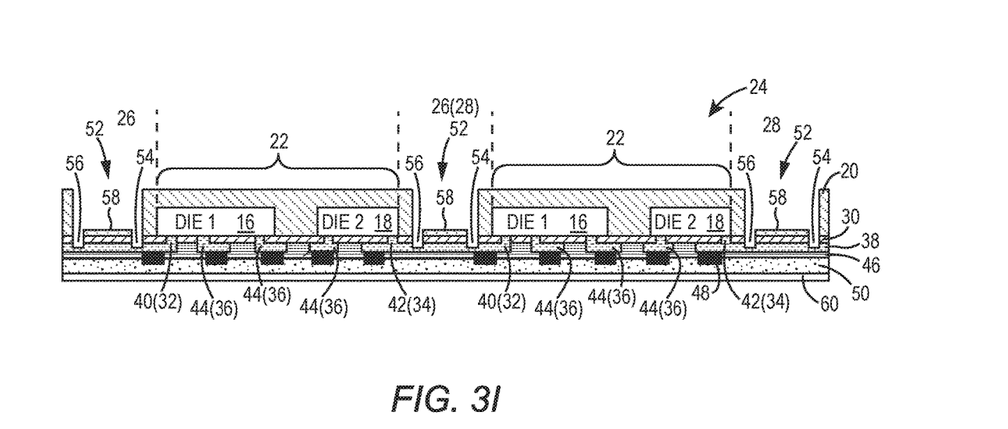

In order to provide additional protection from a subsequent shielding process, which will be described further below, a protective layer 60 may be applied over a bottom surface of the ring tape 50, as depicted in FIG. 3I (Step 118).

Figure 3J:
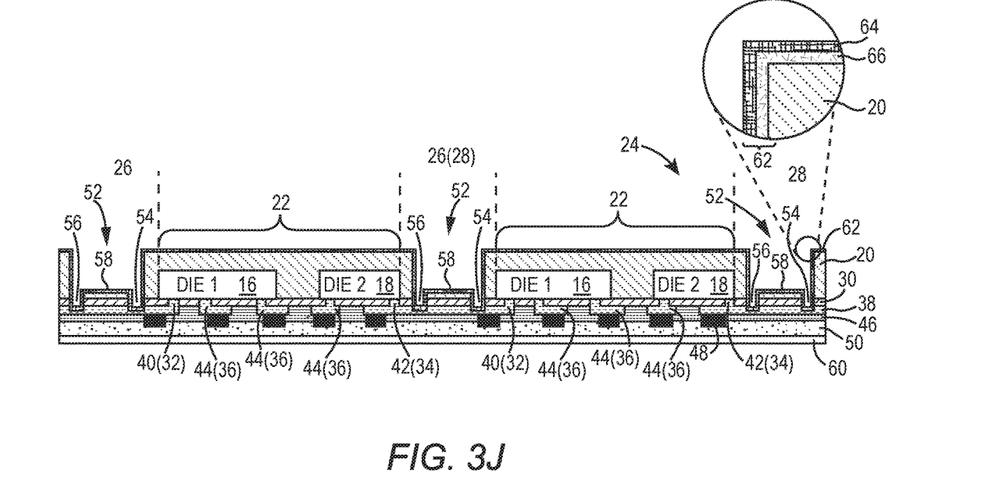

Next, a shield process is used to create a shielding structure 62 over the top surface of the mold wafer 24, any exposed faces of the elongated cavity 52, and channels 54 and 56, as depicted in FIG. 3J (Step 120). As such, the shielding structure 62 is in direct contact with the first shield connected element 40 and the second shield connected element 42 for each of the multiple modules 22. The shielding structure 62 includes at least a first layer 64 and a second layer 66. In one embodiment, the first layer 64 may be formed of nickel with a thickness of 1 μm-3 μms using an electrolytic plating process. The second layer 66 may be formed of copper with a thickness of 3 μms-16 μms using an electroless and/or electrolytic plating process.

Figure 3K:
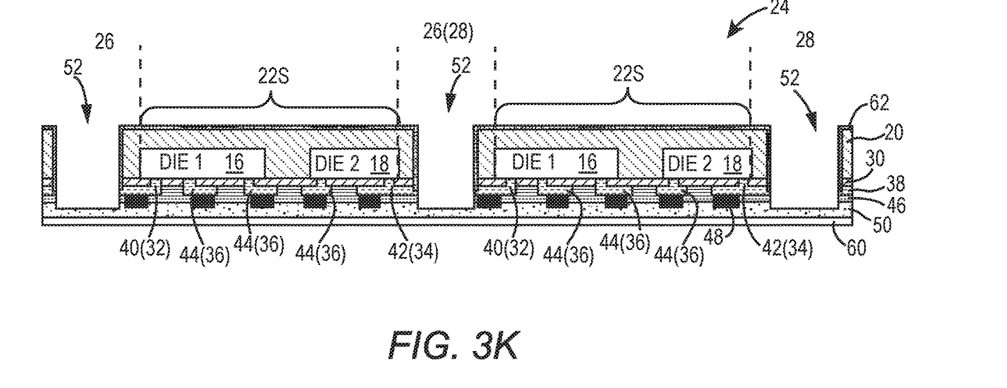
Figure 3L:
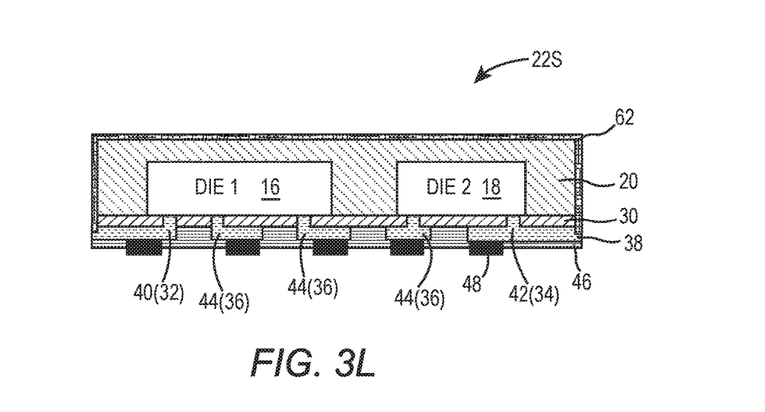

The shielded mold wafer 24 is then singulated at each inter-module area 26/28 to form multiple shielded modules 22S, as depicted in FIG. 3K (Step 122). All or a substantial portion of each inter-module area 26/28 may be destroyed when the multiple modules 22S are separated from one another. Care should be taken to ensure that the shielding structure 62 of each of the multiple shielded modules 22S remains in direct contact with the first shield connected element 40 and the second shield connected element 42. Lastly, as depicted in FIG. 3L (Step 124), the protective layer 60 and the ring tape 50 are removed from each of the multiple shielded modules 22S.

Those skilled in the art will recognize improvements and modifications to the embodiments of the present disclosure. All such improvements and modifications are considered within the scope of the concepts disclosed herein and the claims that follow.

What is claimed is:

1. An apparatus comprising:
a die with a first input/output (I/O) port and a second I/O port at a bottom surface of the die;
a mold compound partially encapsulating the die and leaving the bottom surface of the die exposed;
a first dielectric pattern over the bottom surface of the die, wherein the first I/O port and the second I/O port are exposed through the first dielectric pattern;
a redistribution structure over the first dielectric pattern, wherein:
the redistribution structure comprises a shield connected element and a non-shield connected element;
the shield connected element has a vertical portion coupled to the first I/O port and a lateral portion in contact with the vertical portion;
the lateral portion extends underneath the first I/O port and laterally beyond the die;
the lateral portion has a top surface and a bottom surface; and
the non-shield connected element is coupled to the second I/O port and extends laterally away from the shield connected element;
a second dielectric pattern over the redistribution structure, wherein:
a portion of the bottom surface of the lateral portion of the shield connected element is exposed through the second dielectric pattern; and
a bottom portion of the non-shield connected element is exposed through the second dielectric pattern;
a first bump contact connected to the exposed portion of the bottom surface of the lateral portion of the shield connected element; and
a shielding structure residing over a top surface of the mold compound, extending along side surfaces of the mold compound, and in contact with the first dielectric pattern and the shield connected element, wherein:
the shielding structure extends continuously through the first dielectric pattern and in between the top surface and the bottom surface of the lateral portion of the shield connected element; and
the shielding structure is not in contact with the non-shield connected element.

2. The apparatus of claim 1 wherein the redistribution structure comprises copper.

3. The apparatus of claim 1 wherein the first dielectric pattern is formed of benzocyclobutene (BCB) or polyimide.

4. The apparatus of claim 1 wherein the second dielectric pattern is formed of BCB or polyimide.

5. The apparatus of claim 1 wherein the shielding structure comprises:
a first layer comprising nickel; and
a second layer comprising copper.

6. The apparatus of claim 5 wherein a thickness of the first layer is between 1 μm and 3 μms.

7. The apparatus of claim 5 wherein a thickness of the second layer is between 3 μms and 16 μms.

8. The apparatus of claim 1 wherein a total thickness of the first dielectric pattern, the redistribution structure, and the second dielectric pattern is between 30 μms and 40 μms.

9. The apparatus of claim 1 wherein a total thickness of the die and the mold compound is between 130 μms and 350 μms.

10. The apparatus of claim 1 further comprises a second bump contact connected to the exposed bottom portion of the non-shield connected element.

11. An apparatus comprising:
a first die with a first I/O port at a bottom surface of the first die;
a second die with a second I/O port at a bottom surface of the second die, wherein the bottom surface of the second die and the bottom surface of the first die are coplanar;
a mold compound partially encapsulating the first die and the second die, and leaving the bottom surface of the first die and the bottom surface of the second die exposed;
a first dielectric pattern over the bottom surface of the first die and the bottom surface of the second die, wherein the first I/O port and the second I/O port are exposed through the first dielectric pattern;
a redistribution structure over the first dielectric pattern, wherein the redistribution structure comprises a first shield connected element and a second shield connected element, wherein:
the first shield connected element has a first vertical portion coupled to the first I/O port and a first lateral portion in contact with the first vertical portion;
the first lateral portion extends underneath the first I/O port, laterally beyond the first die, and laterally away from the second die;
the second shield connected element has a second vertical portion coupled to the second I/O port and a second lateral portion in contact with the second vertical portion;
the second lateral portion extends underneath the second I/O port, laterally beyond the second die, and laterally away from the first die; and
the first lateral portion has a first top surface and a first bottom surface, and the second lateral portion has a second top surface and a second bottom surface;
a second dielectric pattern over the redistribution structure, wherein a portion of the first bottom surface of the first lateral portion of the first shield connected element and a portion of the second bottom surface of the second lateral portion of the second shield connected element are exposed through the second dielectric pattern;
a shielding structure residing over a top surface of the mold compound, extending along side surfaces of the mold compound, and in contact with the first dielectric pattern, the first shield connected element, and the second shield connected element, wherein the shielding structure extends continuously through the first dielectric pattern and in between the first top surface and the first bottom surface of the first lateral portion of the first shield connected element, and extends continuously through the first dielectric pattern and in between the second top surface and the second bottom surface of the second lateral portion of the second shield connected element; and
a first bump contact and a second bump contact, wherein the first bump contact is connected to the exposed portion of the first bottom surface of the first lateral portion of the first shield connected element and the second bump contact is connected to the exposed portion of the second bottom surface of the second lateral portion of the second shield connected element.

12. The apparatus of claim 11 wherein the shielding structure comprises:
    a first layer comprising nickel; and
    a second layer comprising copper.

13. The apparatus of claim 12 wherein a thickness of the first layer is between 1 μm and 3 μms.

14. The apparatus of claim 12 wherein a thickness of the second layer is between 3 μms and 16 μms.

* * * * *